United States Patent
Lung

(10) Patent No.: US 10,840,254 B2
(45) Date of Patent: Nov. 17, 2020

(54) PITCH SCALABLE 3D NAND

(71) Applicant: MACRONIX INTERNATIONAL CO., LTD., Hsinchu (TW)

(72) Inventor: Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/204,284

(22) Filed: Nov. 29, 2018

(65) Prior Publication Data
US 2019/0363098 A1   Nov. 28, 2019

Related U.S. Application Data

(60) Provisional application No. 62/674,636, filed on May 22, 2018.

(51) Int. Cl.
*H01L 27/11551* (2017.01)
*H01L 27/11578* (2017.01)
(Continued)

(52) U.S. Cl.
CPC .......... *H01L 27/11551* (2013.01); *G11C 8/08* (2013.01); *G11C 13/0026* (2013.01);
(Continued)

(58) Field of Classification Search
CPC ......... H01L 27/11551; H01L 27/11578; H01L 27/11565; G11C 13/0026; G11C 8/08;
(Continued)

(56) References Cited

U.S. PATENT DOCUMENTS 6,906,940 B1   6/2005 Lue
7,315,474 B2   1/2008 Lue
(Continued)

FOREIGN PATENT DOCUMENTS

CN   20370476      8/2014
CN   203760476 U   8/2014
(Continued)

OTHER PUBLICATIONS

TW Office Action from Application No. 10821066150 dated Nov. 11, 2019, 6 pages (with English Translation).
(Continued)

*Primary Examiner* — Victor A Mandala
(74) *Attorney, Agent, or Firm* — Haynes Beffel & Wolfeld LLP

(57) ABSTRACT

A memory includes a plurality of levels of word lines interleaved with a plurality of levels of channel lines. Horizontal data storage levels are disposed between the plurality of levels of word lines and the plurality of levels of channel lines, the data storage levels including respective arrays of data storage regions in cross points of word lines and channel lines in adjacent levels of the plurality of levels of word lines and the plurality of levels of channel lines. Respective arrays of holes outside of the cross points are disposed in the channel line and word line levels. The channel lines and word lines have sides defined by undercut etch perimeters, along with air gaps or voids between the channel lines and word lines in each level. The word lines, bit lines and data storage nodes in each layer are vertically self-aligned.

20 Claims, 13 Drawing Sheets

(51) Int. Cl.
*G11C 13/00* (2006.01)
*G11C 8/08* (2006.01)

(52) U.S. Cl.
CPC .... *G11C 13/0028* (2013.01); *H01L 27/11578* (2013.01); *G11C 2213/71* (2013.01)

(58) Field of Classification Search
CPC ... G11C 13/0028; G11C 2213/71; G11C 8/14; G11C 16/0483; G11C 2213/75
See application file for complete search history.

(56) References Cited

U.S. PATENT DOCUMENTS

| | | |
|---|---|---|
| 7,420,242 B2 | 9/2008 | Lung |
| 7,696,559 B2 | 4/2010 | Arai et al. |
| 7,851,849 B2 | 12/2010 | Kiyotoshi |
| 8,058,179 B1 | 11/2011 | Draeger et al. |
| 8,159,018 B2 | 4/2012 | Akil |
| 8,208,279 B2 | 6/2012 | Lue |
| 8,363,476 B2 | 1/2013 | Lue et al. |
| 8,467,219 B2 | 6/2013 | Lue |
| 8,486,791 B2 | 7/2013 | Lue |
| 8,501,609 B2 | 8/2013 | Roizin et al. |
| 8,501,629 B2 | 8/2013 | Tang et al. |
| 8,503,213 B2 | 8/2013 | Chen et al. |
| 8,513,725 B2 | 8/2013 | Sakuma et al. |
| 8,659,944 B2 | 2/2014 | Hung et al. |
| 8,759,899 B1 | 6/2014 | Lue et al. |
| 8,890,233 B2 | 11/2014 | Hung et al. |
| 8,952,441 B2 | 2/2015 | Sakuma |
| 9,053,976 B2 | 6/2015 | Ernst et al. |
| 9,076,722 B2 | 7/2015 | Sakuma |
| 9,082,656 B2 | 7/2015 | Chen |
| 9,087,715 B2 | 7/2015 | Kusai |
| 9,117,848 B2 | 8/2015 | Kusai |
| 9,177,809 B2 | 11/2015 | Sakuma |
| 9,196,315 B2 | 11/2015 | Yeh |
| 9,559,049 B1* | 1/2017 | Chiu ................. H01L 23/5226 |
| 9,589,979 B2 | 3/2017 | Hong |
| 9,640,543 B2 | 5/2017 | Choi |
| 9,666,595 B2 | 5/2017 | Sawabe et al. |
| 2004/0124466 A1* | 7/2004 | Walker ............. H01L 27/11568 257/344 |
| 2004/0125629 A1* | 7/2004 | Scheuerlein ....... G11C 16/0483 365/17 |
| 2005/0122779 A1* | 6/2005 | Fasoli .................. G11C 16/04 365/185.17 |
| 2005/0158950 A1* | 7/2005 | Scheuerlein ......... H01L 45/144 438/257 |
| 2005/0280061 A1 | 12/2005 | Lee |
| 2006/0275962 A1 | 12/2006 | Lee |
| 2007/0045708 A1 | 3/2007 | Lung |
| 2007/0252201 A1 | 11/2007 | Kito et al. |
| 2008/0073635 A1 | 3/2008 | Kiyotoshi et al. |
| 2008/0175032 A1 | 7/2008 | Tanaka et al. |
| 2008/0180994 A1 | 7/2008 | Katsumata et al. |
| 2009/0065850 A1 | 3/2009 | Oh et al. |
| 2009/0097321 A1 | 4/2009 | Kim et al. |
| 2009/0184360 A1 | 7/2009 | Jin et al. |
| 2010/0078701 A1 | 4/2010 | Shim et al. |
| 2010/0208509 A1* | 8/2010 | Maejima .................. G11C 5/02 365/148 |
| 2010/0270593 A1 | 10/2010 | Lung et al. |
| 2011/0169072 A1 | 7/2011 | Lim |
| 2012/0068241 A1 | 3/2012 | Sakuma et al. |
| 2012/0117316 A1 | 5/2012 | Park |
| 2012/0119283 A1 | 5/2012 | Lee et al. |
| 2012/0182806 A1 | 7/2012 | Chen et al. |
| 2012/0182808 A1 | 7/2012 | Lue et al. |
| 2013/0099306 A1 | 4/2013 | Choi |
| 2013/0119455 A1 | 5/2013 | Chen et al. |
| 2013/0161717 A1 | 6/2013 | Choi |
| 2013/0175598 A1 | 7/2013 | Chen et al. |
| 2013/0334575 A1 | 12/2013 | Chen et al. |
| 2014/0011334 A1 | 1/2014 | Cho |
| 2014/0264897 A1 | 9/2014 | Chiu et al. |
| 2015/0060958 A1 | 3/2015 | Chen |
| 2015/0076668 A1 | 3/2015 | Shih et al. |
| 2015/0115455 A1 | 4/2015 | Chen |
| 2015/0214239 A1 | 7/2015 | Rhie |
| 2015/0340369 A1 | 11/2015 | Lue |
| 2015/0340371 A1* | 11/2015 | Lue ................. H01L 27/11582 257/324 |
| 2016/0141299 A1 | 5/2016 | Hong |
| 2016/0315097 A1* | 10/2016 | Hsu ..................... H01L 27/1157 |
| 2019/0355903 A1* | 11/2019 | Lung ................... H01L 45/1625 |

FOREIGN PATENT DOCUMENTS

| | | |
|---|---|---|
| EP | 2048709 A2 | 4/2009 |
| EP | 2259306 A1 | 12/2010 |
| KR | 1020130097562 A | 3/2013 |
| TW | 201238033 A | 9/2012 |
| TW | 201517250 A | 5/2015 |
| TW | 201620077 A | 6/2016 |
| WO | 2011004945 A1 | 1/2011 |

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

Fukuzumi et al. "Optimal Integration and Characteristics of Vertical Array Devices for Ultra-High Density, Bit-Cost Scalable Flash Memory," IEEE Dec. 10-12, 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE Int'l Electron Devices Meeting, Dec. 11-13 2006, 4 pages.

Katsumata et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009, Jun. 16-18, 2009, 2 pages.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Lai, et al., "A Multi-Layer Stackable Thin-Film Transistor (TFT) NAND-Type Flash Memory," IEEE Int'l Electron Devices Meeting, Dec. 11-13, 2006, pp. 1-4.

(56) References Cited

OTHER PUBLICATIONS

Li, et al. "Evaluation of SiO2 Antifuse ina 3D-OTP Memory," IEEE Transaction on Device and Materials Reliability, vol. 4, No. 3, Sep. 2004, pp. 416-421.

Lue, H-T. et al., "A Highly Scalable 8-Layer 3D Vertical-Gate (VG) TFT NAND Flash Using Junction-Free Buried Channel BE-SONOS Device," Jun. 15-17, 2010 Symp. on VLSI Technology, Digest of Technical Papers, pp. 131-132.

Nowak et al., "Intrinsic fluctuations in Vertical NAND flash memories," 2012 Symposium on VLSI Technology, Digest of Technical Papers, pp. 21-22, Jun. 12-14, 2012.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

U.S. Appl. No. 15/950,021, filed Apr. 10, 2018, entitled String Select Line Gate Oxide Method for 3D Vertical Channel NAND Memory, 66 pages.

Wang, Michael "Technology Trends on 3D-NAND Flash Storage", Impact 2011, Taipei, dated Oct. 20, 2011, found at 222.impact.org.tw/2011/files/newsfile/201111110190.pdf.

Yun et al, "Stacked-nanowire device with virtual source/drain (SD-VSD) for 3D NAND flash memory application," Solid-State Electronics, vol. 64, pp. 42-46 (Jul. 26, 2011).

Choi et al., "3D approaches for non-volatile memory", 2011 Symposium on VLSI Technology, Digest of Technical Papers, pp. 178-179, Jun. 14-16, 2011.

Choi et al., "Performance Breakthrough in NOR Flash Memory with Dopant-Segregated Schottky-Barrier (DSSB) SONOS Device", 2009 Symposium onVLSI Technology Digest of Technical Papers, Jun. 16-18, 2009, pp. 1-2.

Johnson et al., "512-Mb PROM With a Three-Dimensional Array of Diode/Anti-fuse Memory Cells" IEEE J. of Solid-State Circuits, vol. 38, No. 11, Nov. 2003.

\* cited by examiner

PITCH SCALABLE 3D NAND

PRIORITY APPLICATION

This application claims the benefit of U.S. Provisional Patent Application No. 62/674,636 filed 22 May 2018; which application is incorporated herein by reference.

BACKGROUND

Field

The present invention relates to three-dimensional 3D memory structures, and more particularly to 3D memory.

Description of Related Art

Integrated circuit memory technologies are being developed that enable storing more and more data on a single integrated circuit. One approach to increasing the amount of data stored involves 3D memory structures. 3D structures having many planes of memory cells can be complicated. They often involve manufacturing techniques such as the formation of deep trenches and holes that can limit the density of the 3D structures. In some vertical 3D memory structures, for example, x-y scaling is limited even as manufacturing techniques improve for trenches and holes, because of the requirement of charge trapping structures or other memory cell structures on the sidewalls of vertical channels or conductors. These problems can be multiplied as the number of planes increases, further limiting the scalability of some 3D structures.

It is desirable to provide 3D memory structures suitable for flash memory, and other memory types, that are scalable, provide high density and are readily manufacturable.

SUMMARY

A scalable 3D memory structure is described herein.

A memory is described that comprises a plurality of levels of word lines extending in a word line direction and interleaved with a plurality of levels of channel lines extending in a channel line direction. Data storage levels, such as dielectric charge trapping data storage levels, are disposed between the plurality of levels of word lines and the plurality of levels of channel lines. The data storage levels include respective arrays of data storage regions self-aligned in cross points of word lines and channel lines in adjacent levels, and respective arrays of holes outside of the cross points. Also, the channel lines in the plurality of levels are self-aligned with respect to other channel lines; and the word lines in the plurality of levels are self-aligned with respect to other word lines.

In particular, the word lines are self-aligned in the sense that their alignment in the stack occurs without a separate step in the manufacturing process requiring lithographic alignment with the word lines in other levels. In a process described herein, their location is defined by the perimeter of lateral selective etching though the holes used to define the word lines. Also, the channel lines are self-aligned in the sense that their alignment in the stack occurs without a separate step in the manufacturing process requiring lithographic alignment with the channel lines in other levels. In a process described herein, their location is defined by the perimeter of lateral selective etching though the holes used to define the channel lines.

Furthermore, the data storage regions are self-aligned in the sense that their location in the cross points occurs without a separate step in the manufacturing process requiring lithographic alignment with the word lines and channel lines. In a process described herein, their location is defined by the cross points of the self-aligned word lines and channel lines. In alternatives, an additional lateral undercut etch through these same holes, can be applied to form islands of data storage material, that are also self-aligned, having sides defined by the perimeter of lateral selective etching though the holes used to define the word lines and channel lines.

A structure is described in which the levels of word lines include a plurality of word lines with voids that form seams between the word lines. Also, a structure is described in which the levels of channel lines include a plurality of channel lines with voids that form seams between the channel lines.

A structure is described in which the word lines in the plurality of levels of word lines have regions between the cross points that are more narrow than the regions in the cross points. Also, a structure is described in which the channel lines in the plurality of levels of channel lines have regions between the cross points that are more narrow than the regions in the cross points. In embodiments described herein, the sides of the word lines and the sides of the channel lines are undercut etch perimeters (caused by lateral selective etching though vertical holes) spaced away by an undercut process from the holes in the array of holes.

Also a process is described for manufacturing a memory cell structure as described herein. In one embodiment, the process includes:

forming a stack of levels of material, the stack including levels of word line material and levels of channel line material separated by charge trapping levels;

etching channel line elliptical holes in the stack having major axes in the channel line direction;

selectively laterally etching the channel line material exposed in the channel line elliptical holes to form channel lines in the plurality of levels of channel line material, without substantial removal of material in at least some other levels of the stack;

etching word line elliptical holes in the stack having major axes in the word line direction;

selectively laterally etching the word line material exposed in the word line elliptical holes to form word lines in the plurality of levels of word line material, without substantial removal of material in at least some other levels of the stack;

wherein the arrays of holes include holes formed by the combination of the word line elliptical holes and the channel line elliptical holes.

In general, a memory cell structure is described that is scalable in the X-Y dimensions as manufacturing processes are deployed to make smaller and smaller features. Also, the process involves only two lithographic steps for a large number of levels of memory cells.

Other aspects and advantages of the present invention can be seen on review of the drawings, the detailed description and the claims, which follow.

DETAILED DESCRIPTION

A detailed description of embodiments of the present invention is provided with reference to the FIGS. 1-14.

Figure 1:
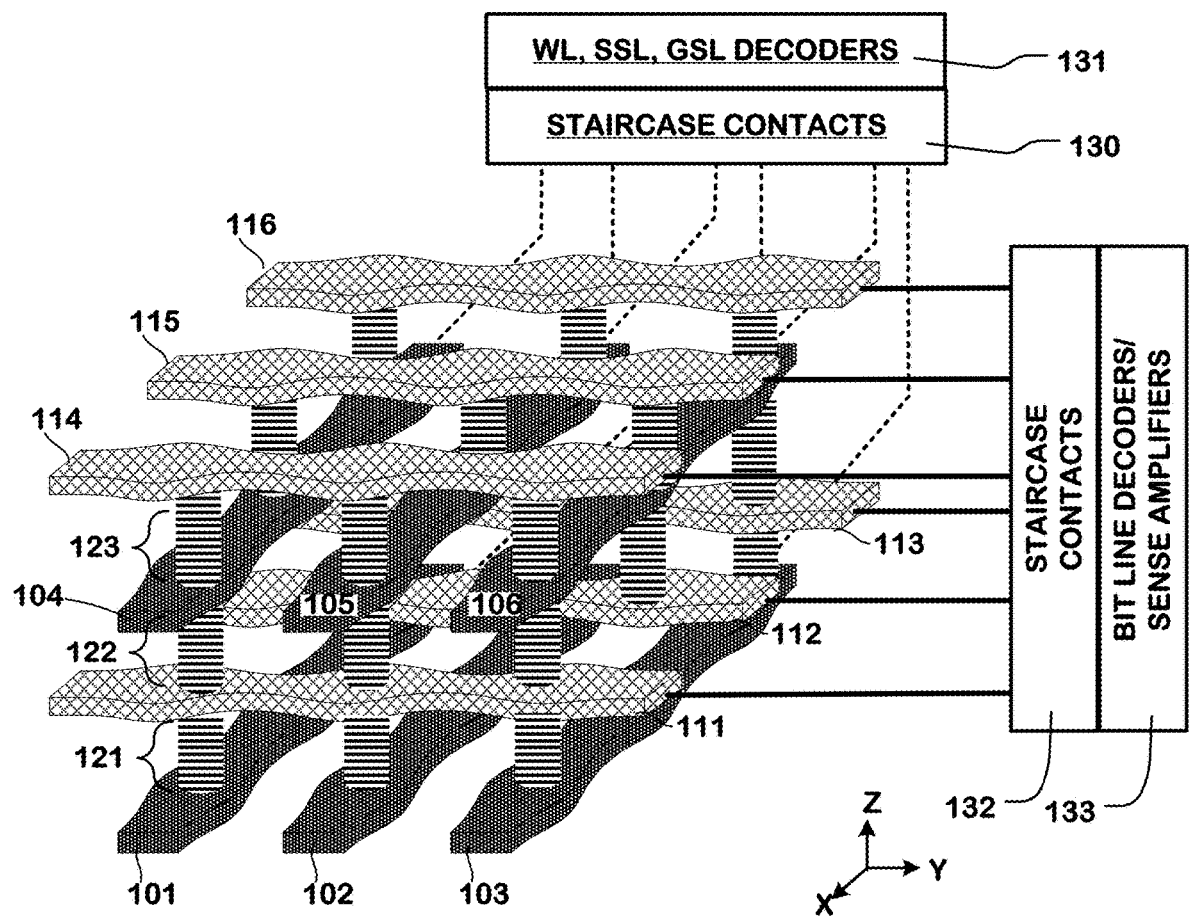
FIG. 1 is a simplified 3D perspective of a portion of a 3D memory array as described herein.

FIG. 1 is a perspective drawing of a 3D memory structure according to the technology described herein, simplified for the purposes of description. The structure includes a stack of horizontal memory levels. The stack includes a plurality of levels of word lines, which in this example includes a first level of word lines 101, 102, 103 and a second level of word lines 104, 105, 106. The word lines in the word line levels extend in a word line direction (parallel with the X-axis in this illustration). In embodiments, as discussed in more detail below, there can be voids that form seams (air gaps) between the word lines.

The stack of horizontal memory levels in FIG. 1 also includes a plurality of levels of channel lines, which in this example includes a first level of channel lines 111, 112, 113 and a second level of channel lines 114, 115, 116. The channel lines in the channel line levels extend in a channel line direction (parallel with the Y-axis in this illustration). In embodiments, as discussed in more detail below, there can be voids that form seams (air gaps) between the channel lines.

The stack includes charge trapping levels between the levels of word lines and the levels of channel lines. In this example, memory cell regions in corresponding cross points of the word lines and channel lines are schematically illustrated, including memory cell charge storage region 121 in a first charge trapping level in the cross point of word line 101 and the adjacent channel line 111, memory cell charge storage region 122 in a second charge trapping level in the cross point of word line 104 and the adjacent channel line 111, and memory cell charge storage region 123 in a third charge trapping level in the cross point of word line 104 and the adjacent channel line 114

As illustrated in the figure, the word lines in the plurality of word lines in each word line level have wavy sides as a result of being formed by the perimeters of a lateral etch process as described below. The wavy sides are aligned so that the word lines have regions between the cross points that are more narrow than regions in the word lines in the cross points.

Also, as illustrated in the figure, the channel lines in the plurality of channel lines in each channel line level have wavy sides as a result of being formed as the perimeters of a lateral etch process as described below. The wavy sides are aligned so that the channel lines have regions between the cross points that are more narrow than regions in the channel lines in the cross points.

In the embodiment described, the charge trapping levels are used to store data. The charge trapping levels can be, for example, multiple layer dielectric charge trapping structures, or multiple layer floating gate charge trapping structures. A charge trapping memory like that of FIG. 1 can be a flash memory.

Other memory technologies can be utilized as well, such as using data storage materials in place of the charge trapping layers. For example, the data storage levels can comprise programmable resistance technologies such as phase change memory, metal oxide memory, and so on.

In the embodiment described, the 3D structure comprises a plurality of NAND strings in each NAND memory level. The example shows only three cells in each string. String select gates and ground select gates (not shown) are included in the NAND strings for typical NAND structures.

The levels of word lines are coupled to staircase contacts 130 or other contact structures for interconnection with peripheral circuits, including decoders 131 for word lines, string select lines and ground select lines. Likewise, the levels of channel lines are coupled to staircase contacts 132 or other contact structures for interconnection with peripheral circuits, including bit line decoders/sense amplifiers 133.

Figure 2:
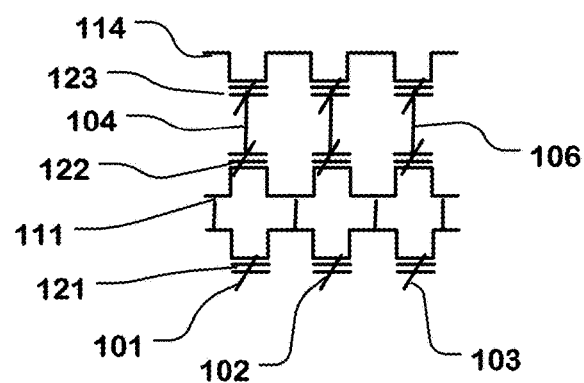
FIG. 2 is a simplified schematic diagram of one slice of the array shown in FIG. 1.

FIG. 2 is a schematic diagram of one slice of the 3D structure of FIG. 1. This schematic corresponds with the slice including the channel lines 111 and 114. Thus, a horizontal NAND string in a first level includes memory cells at the cross points of word lines 101, 102 and 103 with the channel line 111, and a charge storage region 121. A horizontal NAND string in a second level includes memory cells at the cross points of word lines 104, 105, 106 with the channel line 111. Thus, it can be seen that, in this example, the memory cells in the first and second levels share a common channel line 111.

A horizontal NAND string in a third level includes memory cells at the cross points of word lines 104, 105, 106 with the channel line 114. Thus, it can be seen that, in this example, the memory cells in the second and third levels share common word lines 104, 105, 106. In other embodiments, the 3D memory structure includes another word line level above word lines 104, 105, 106, in which case the memory cells in the second and third planes do not share the same word lines.

Figure 3A:
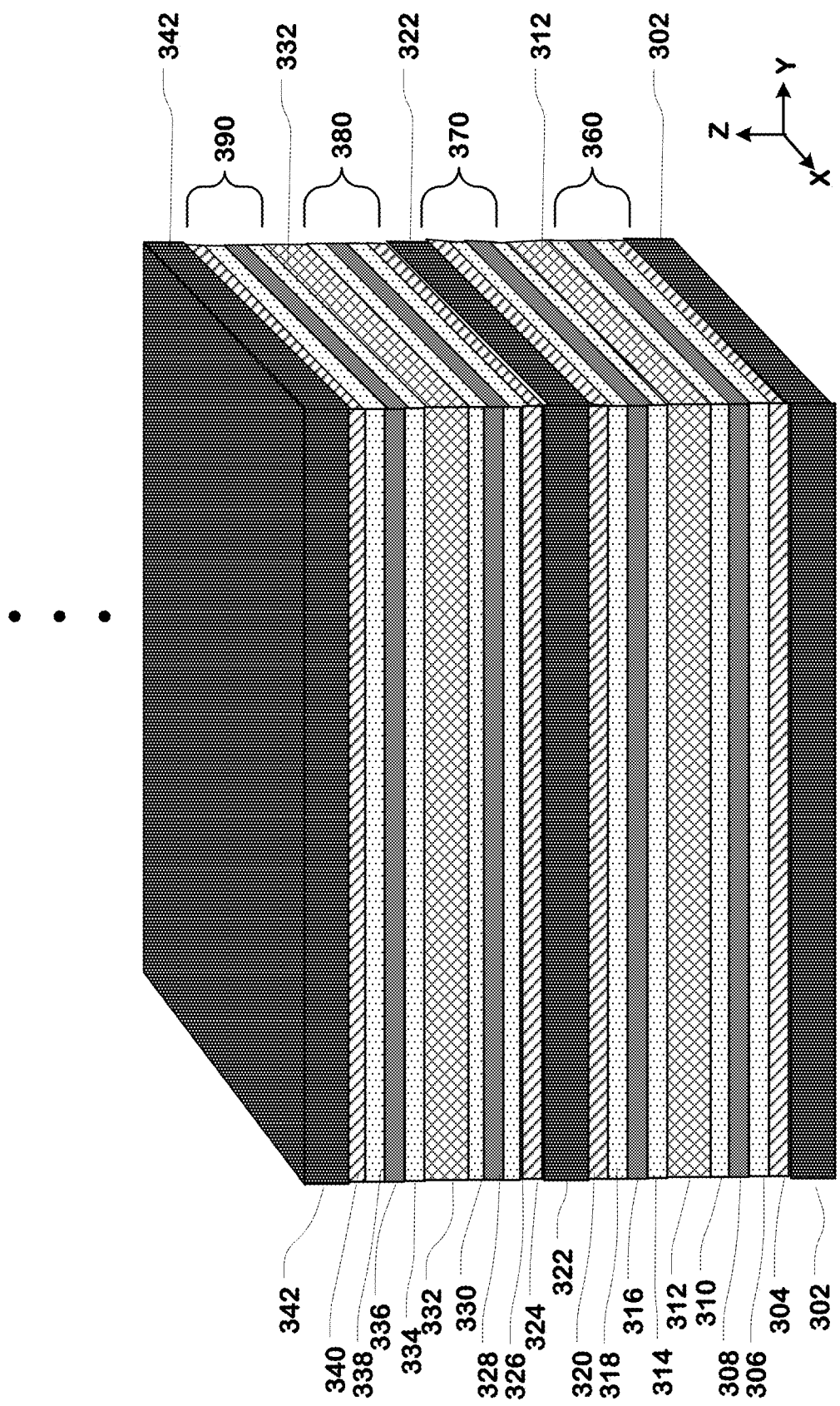
FIGS. 3A, 3B and 4-10 illustrate a manufacturing method by showing subassemblies formed during manufacture of a 3D memory array as described herein.

A process for manufacturing a 3D memory structure as described herein can be understood with reference to FIGS. 3A, 3B and 4-11. In FIG. 3A, an assembly that results from forming a stack of levels of material is shown. The levels of material in the illustrated example include starting from the bottom on an integrated circuit substrate (not shown), in some embodiments, a bottom level 302 of word line material, a data storage level 360 disposed on the bottom level 302, a level 312 of channel line material, a data storage level 370 disposed on the level 312, a level 322 of word line material, a data storage level 380 disposed on the level 322, a level 332 of channel line material disposed on the data storage level 380, a data storage level 390 disposed on the level 332, and a level 342 of word line material disposed on the data storage level 390.

In an embodiment suitable for use in formation of a NAND flash array, the word line material in the levels 302, 322, 342 can comprise tungsten about 10 nm thick, or other conductive materials. The thickness can be variable according to different materials or different conductance specifications for the structure. The word line material utilized should be selected for compatibility with the lateral etching recipes utilized and subsequent steps, and for its suitability as a word line material for the memory technology utilized.

Also, the channel line material in the levels 312, 332 can comprise a semiconductor such as silicon or polysilicon about 10 nm thick. The thickness can be variable according to different materials or different conductance specifications for the structure. The semiconductor of the channel line material can be doped or undoped as suitable for its use as a channel line material. Other semiconductors can be utilized.

The data storage level can comprise multiple dielectric layers. In the illustrated example, the data storage level 360 includes dielectric layers 304, 306, 308, 310. The data storage level 370 includes dielectric layers 314, 316, 318, 320. The data storage level 380 includes dielectric layers 324, 326, 328, 330. The data storage level 390 includes the dielectric layers 334, 336, 338, 340. In a representative data storage structure, the layers 310, 314, 330, 334 can comprise tunneling layers such as a silicon oxynitride layer or a multilayer tunneling layer about 6 nm thick. The layers 308, 316, 328, 336, can comprise charge storage layers such as silicon nitride about 5.5 nm thick. The layers 306, 318, 326, 338 can comprise blocking layers such as silicon oxide about 5.5 nm thick. Also, the layers 304, 320, 324, 340 can comprise blocking layers of aluminum oxide about 3 nm thick. In this example structure, the data storage level has a thickness on the order of 20 nm. Other data storage structures can be utilized as well.

Figure 3B:
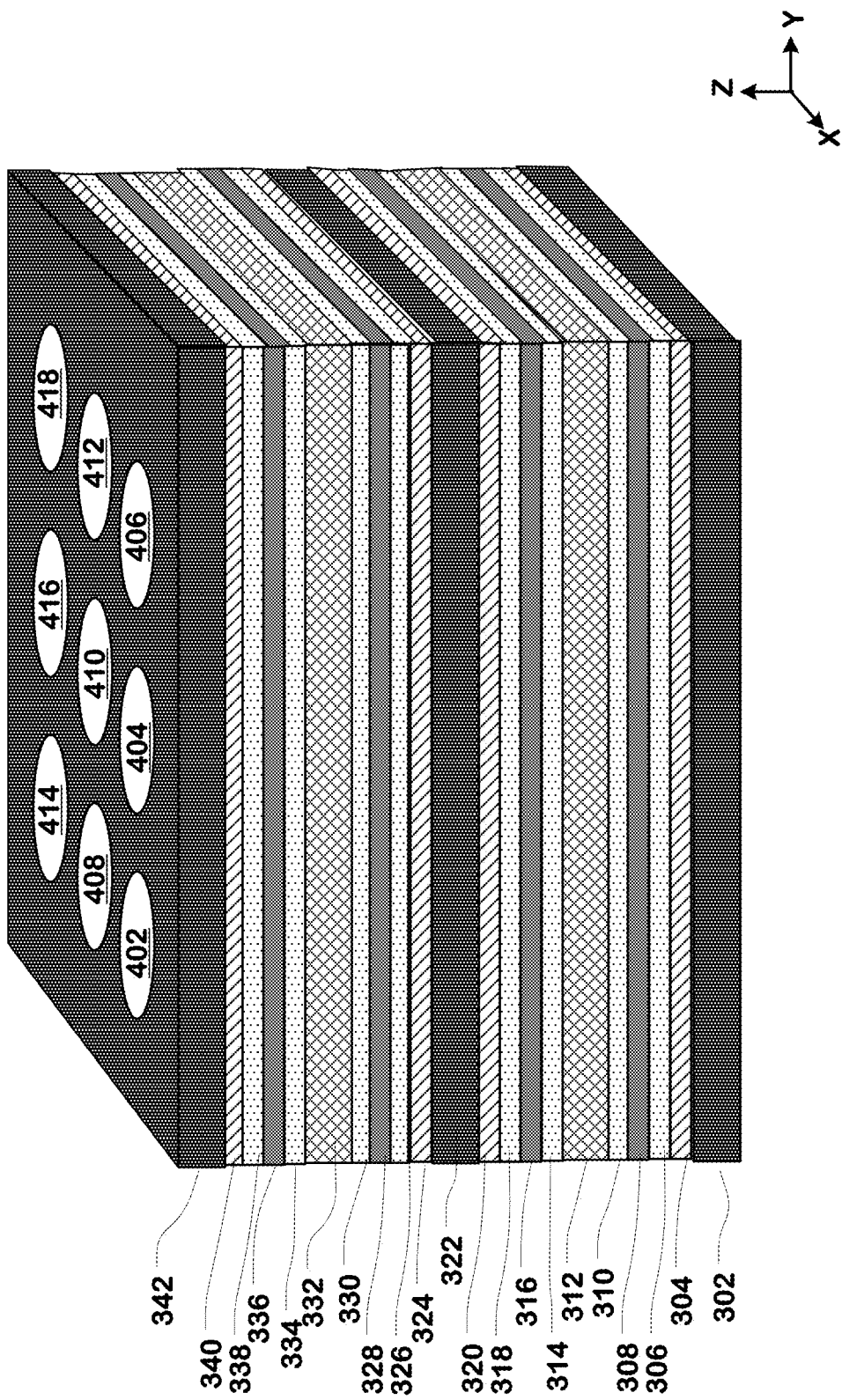

FIG. 3B illustrates the subassembly after a next stage in the manufacturing. This next stage involves etching an array of channel line elliptical holes having major axes aligned in a channel line direction (Y-axis) for the structure. The holes are elliptical, or like ellipses, in the sense that they have, in cross-section, oblong shapes (including rectangular shapes) with major axes and minor axes analogous to those of ellipse-shaped holes usable in the process described herein. In this illustration, the holes are shown arranged in the stack taken from the example of FIG. 3. The array of holes includes holes 402, 404, 406 having major axes aligned in a channel line direction, holes 408, 410, 412 having major axes aligned in a channel line direction, and holes 414, 416, 418 having major axes aligned in a channel line direction. The shape of the elliptical holes, by which the width the holes along the major axes (Y-axis) is less than the length of the holes along the minor axes (X-direction) supports splitting of the holes as described herein, and compact layouts. This hole etching can be executed using reactive ion etching with a lithographic mask to define the positions in shapes of the holes. The holes extend through the stack to the underlying substrate in this example.

Figure 4:
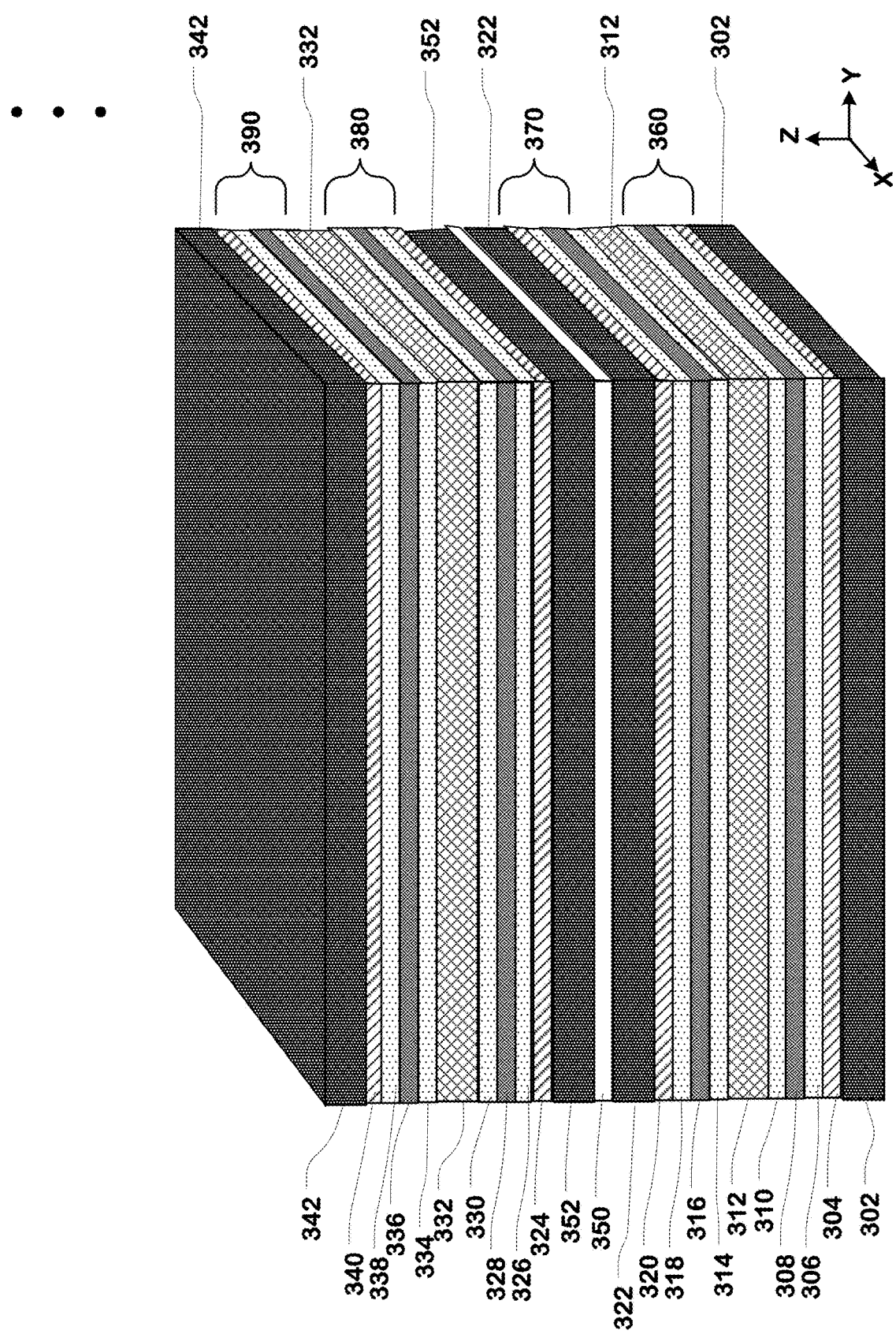

FIG. 4 illustrates an alternative embodiment in which the stack of levels provides for separated levels of word lines rather than shared levels of word lines for the memory cells. Thus, the structure of FIG. 4 is like that of FIG. 3A with the addition of level 352 of word line material and level 350 of insulating material. The reference numerals utilized in FIG. 4 are the same as those used in FIG. 3A for the same elements of the figure. The level 352 can comprise tungsten or other suitable word line material as discussed above. The level 350 can comprise silicon oxide or other material chosen for compatibility with the manufacturing processes scribed below. The addition of the level 352 does not change the manufacturing sequence.

Also, in the illustrated examples, the number of levels provided is suitable for making four levels of memory cells. The number of levels of memory cells utilized in a particular embodiment can be much greater.

Figure 5:
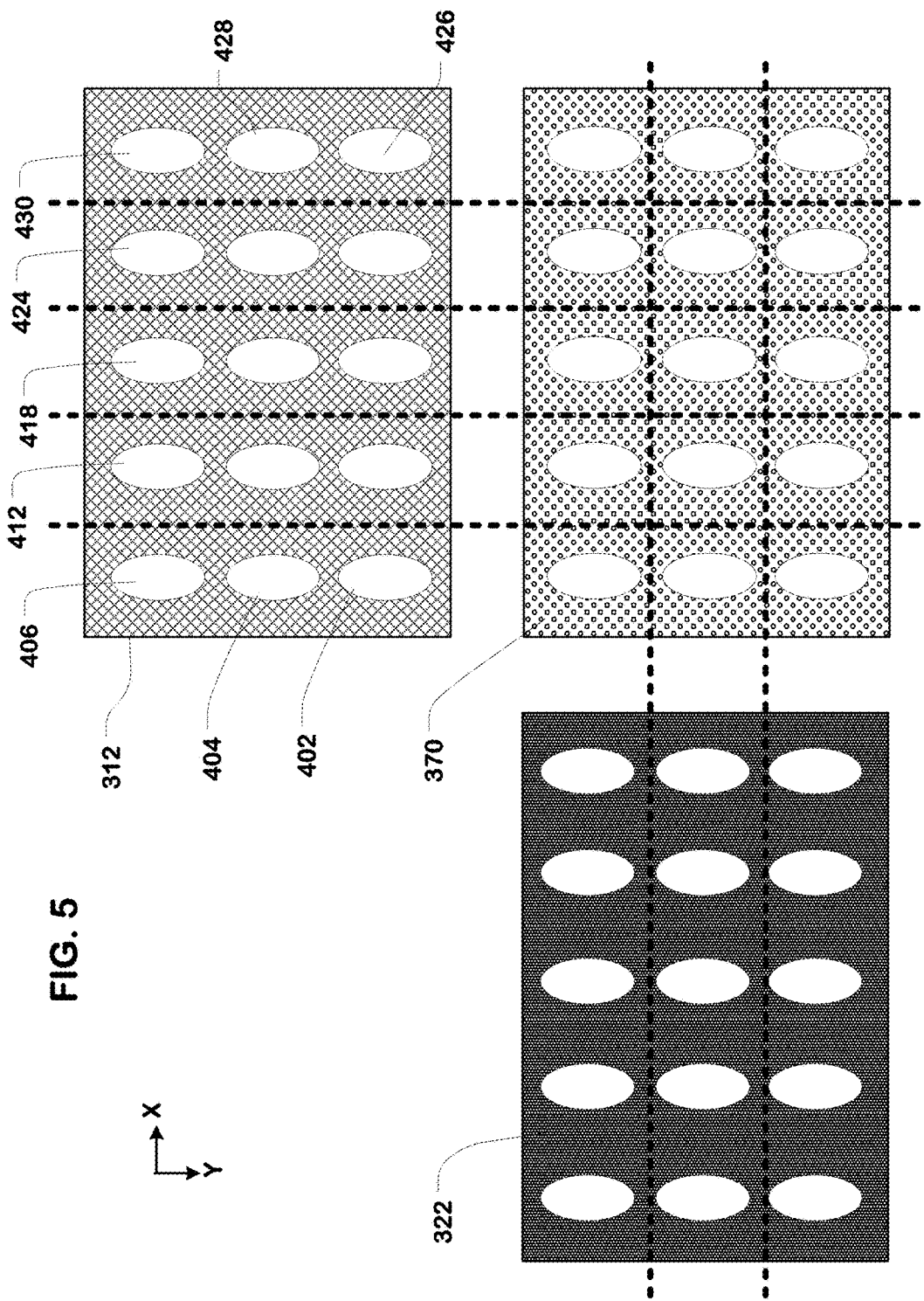
Figure 6:
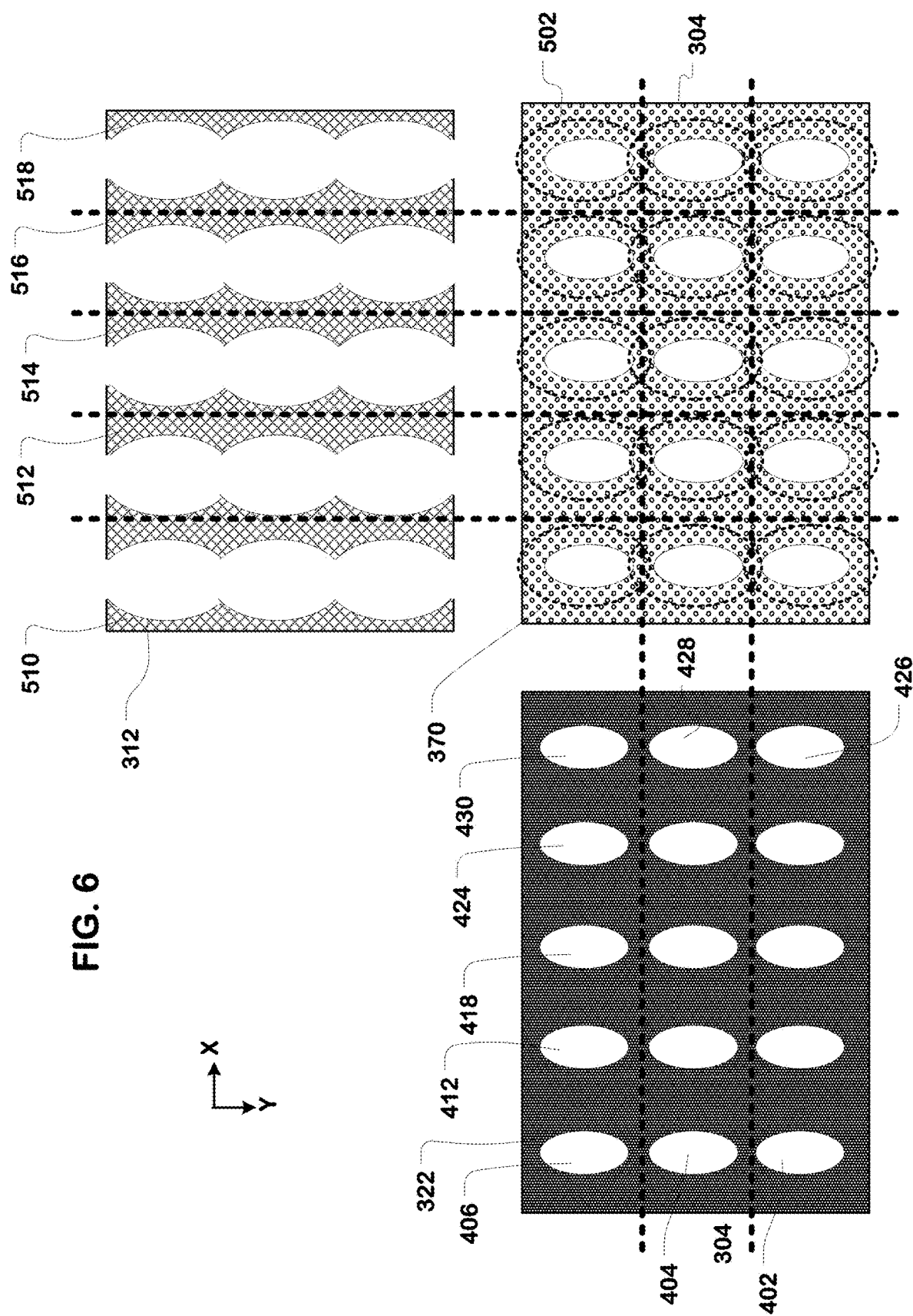

FIG. 5 illustrates the arrangement of the array of holes in a word line level 322, a channel line level 312, and a data storage level 370. In the assembly being manufactured, these levels are arrayed one on top of the other and the holes shown in the illustrations are the same holes. Thus, the holes shown in FIG. 6 are given the same reference numerals as shown in FIG. 5. In this example, however, there are five lines of holes rather than just three as shown in FIG. 5. Therefore, additional elliptical holes 424, 430, 428, 426 are labeled.

In the illustration, the hatched lines represent the locations of channel lines and word lines to be formed, and cross points at which data storage regions result.

FIG. 6 illustrates the same levels 312, 370, 322 after lateral undercut etching the channel line material exposed in the channel line elliptical holes. The lateral etching does not affect the data storage level 370 or the word line level 322. The lateral etching occurs approximately at the same rate in the channel line direction as in the direction orthogonal thereto. The ovals (e.g. 502) illustrated on the data storage level 370 in this figure represent the lateral undercut etch perimeters in the channel line material performed through the channel line holes. As seen, because the spacing between the channel line holes in the channel line direction is less than the spacing between the channel line holes in the orthogonal direction, the lateral undercut etch perimeters intersect in the channel line direction and etching results in formation of a plurality of self-aligned channel lines 510, 512, 514, 516 in the levels of channel line materials in the stack, with voids between the channel lines in the plurality of channel lines. The edges of the channel lines are formed as the lateral undercut etch perimeters of the channel line material. The channel lines are self-aligned in the sense that their alignment in the stack occurs without a separate step in the manufacturing process requiring lithographic alignment with the channel lines in other levels. In a process described herein, their location is defined by the perimeter of lateral selective etching though the holes used to define the channel lines.

The selective lateral undercut etch can be executed for a polysilicon channel line level using potassium hydroxide or sodium hydroxide chemistry.

Figure 7:
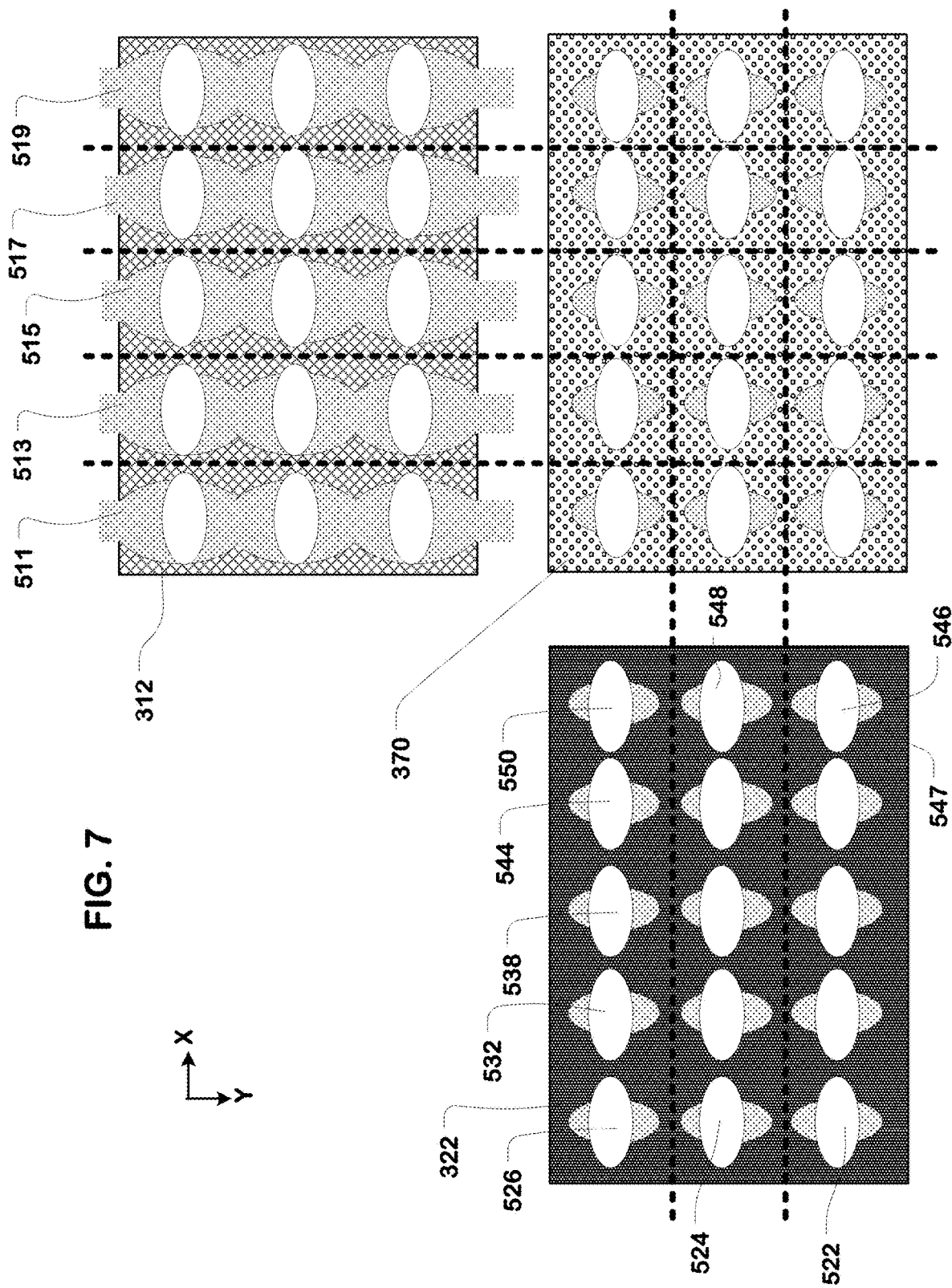

FIG. 7 illustrates the structure of the three levels (312, 370, 322) after additional manufacturing steps. In particular, to result in the structure of FIG. 8, the channel line holes are first filled using, for example, an organic planarization material.

Then, the manufacturing process includes etching an array of word line elliptical holes having major axes aligned in a word line direction for the structure. This word line direction in this example is orthogonal to the channel line direction. Word line elliptical holes include holes 526, 532, 538, 544, and 550 having major axes aligned in a word line direction. Also, other word line elliptical holes are aligned as illustrated, including holes 524 and 548 having major axes aligned in the word line direction, and holes 522 and 546 having major axes aligned in the word line direction. The word line holes can be etched using a lithographic process including a photoresist, a silicon based antireflection coating and the organic planarization layer that fills the holes. Using the mask formed by the lithographic process, reactive ion etching can be used to form the array of elliptical word line holes.

Also illustrated in the figure is the fill material remaining after the etching of the word line elliptical holes, filling the channel line elliptical holes in the word line level 322 and in the data storage level 370, and filling the voids (e.g, fill 511, 513, 515, 517, 519) between the channel lines in the channel line level 312.

Figure 8:
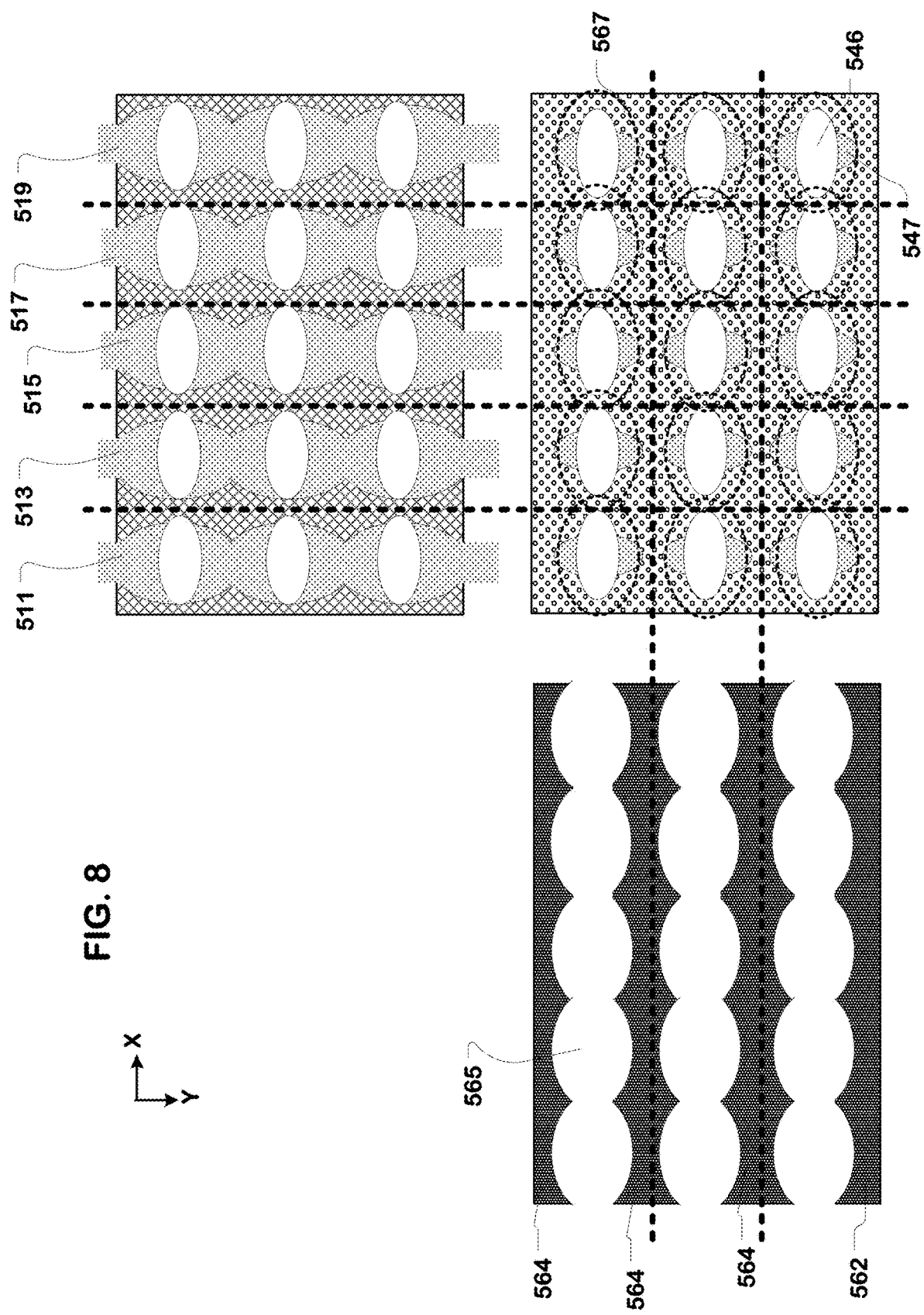

FIG. 8 illustrates the structure of the three levels (312, 370, 322) after additional manufacturing steps including a lateral undercut etch in the word line material levels exposed in the word line elliptical holes. The lateral etching does not affect the data storage level 370, the fill material (511, 513, 515, 517, 519, 547) or the channel lines in the channel line level. The lateral etching occurs at approximately the same rate in the word line direction as in the direction orthogonal thereto. The ovals (e.g. 567) illustrated in the data storage level 370 in this figure represent lateral undercut etch perimeters in the word line material. As seen, the spacing between the word line holes in the word line direction is less than the spacing between the word line holes in the orthogonal direction, lateral undercut etch perimeters intersect in the word line direction, and etching results in formation of a plurality of word lines 562, 564. Also voids (e.g. 565) are left between the word lines in the plurality of word lines. As illustrated, the edges of the word lines are formed as the lateral undercut etch perimeters of the word line material.

The word lines are self-aligned in the sense that their alignment in the stack occurs without a separate step in the manufacturing process requiring lithographic alignment with the word lines in other levels. In a process described herein, their location is defined by the perimeter of lateral selective etching though the holes used to define the word lines.

The selective lateral undercut etch of a word line material such as tungsten can be executed using an ammonium hydroxide or hydrogen peroxide etch chemistry.

Figure 9:
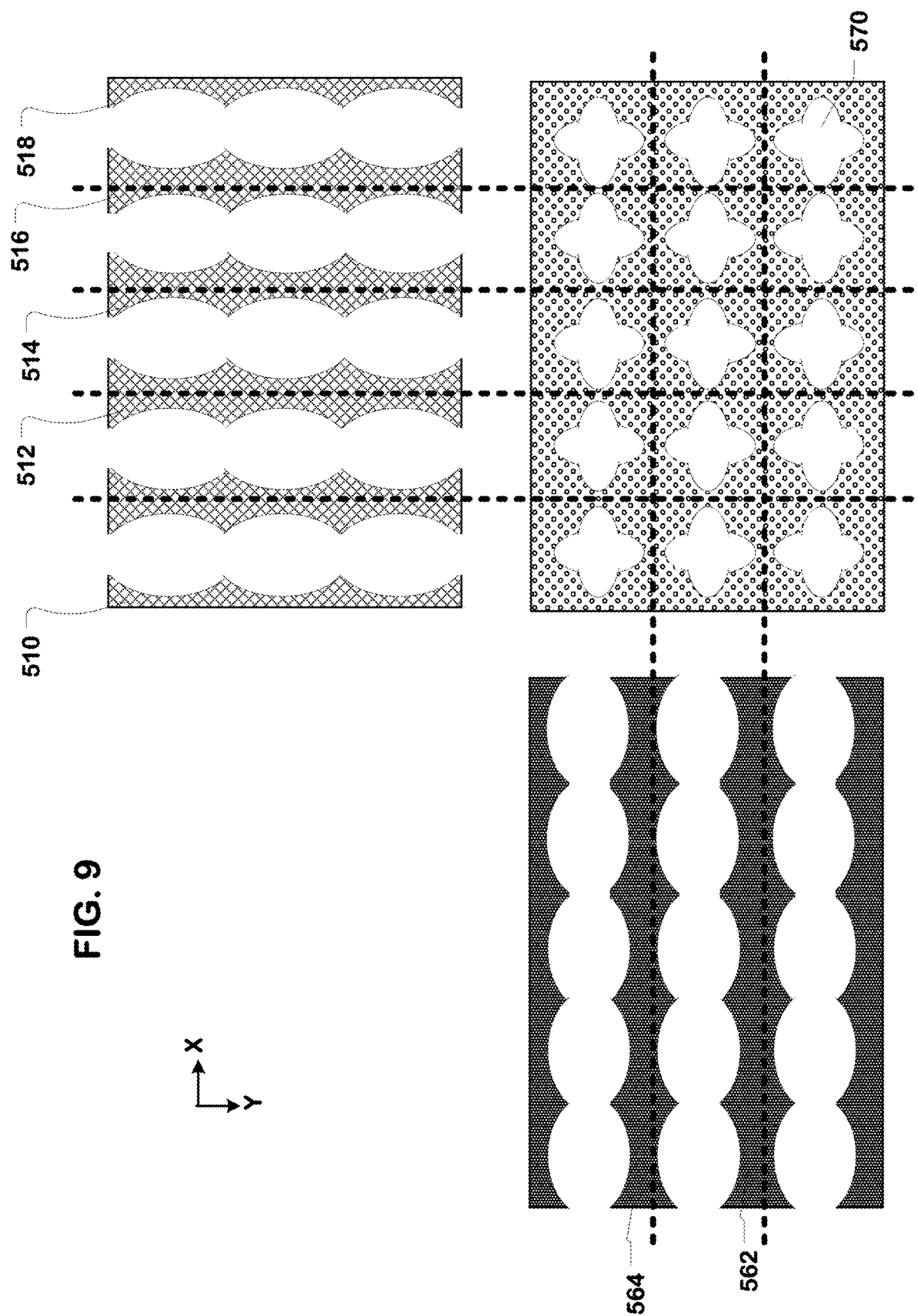

FIG. 9 illustrates the three levels (312, 370, 322) after additional manufacturing steps involving removal of the organic planarization layer. This removal can be executed using an oxygen or nitrogen plasma, leaving the plurality of channel lines 510, 512, 514, 516 in the channel line level, and the plurality of word lines 562, 564 in the word line level. Holes (e.g. hole 570) remain in the data storage level which resulted from the etching of the channel line elliptical holes and the word line elliptical holes. As can be seen, data storage material is left at the cross points of the channel lines and the word lines. No further etch of the data storage material is required for dielectric memory materials. In the case of conductive memory materials, an additional selective lateral undercut etch can be applied, to divide the data storage levels into islands of data storage material, self-aligned in the cross points.

Figure 10:
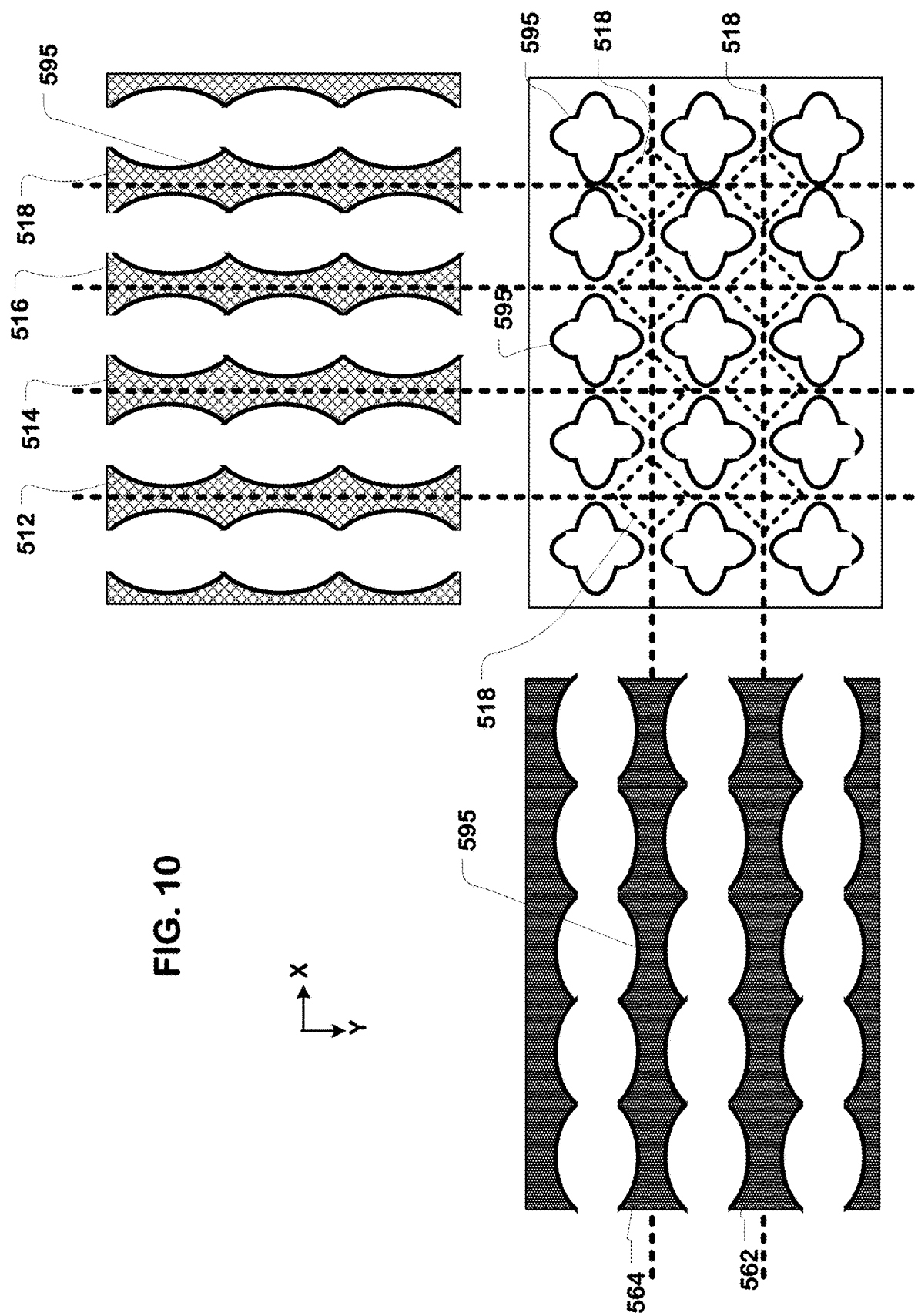

FIG. 10 illustrates the structure of FIG. 9, after additional manufacturing steps including depositing a thin-film 595 on the order of a few Angstroms thick using atomic layer deposition or other deposition technology of a silicon nitride or other dielectric on the sidewalls of the holes in the data storage level, and on the edges of the channel lines and the word lines.

Also, in FIG. 10 the hatching is removed from the data storage level 370 in order to illustrate the data storage regions (e.g. regions labeled 518) in the cross points of the channel lines and the word lines. In this example, the data storage regions are dielectric data storage regions, and need not be physically separated. Thus, they correspond with the areas of electric field established between the channel line levels and the word line levels and resultant charge tunneling during the programming and erasing processes for these types of structures. As illustrated, the data storage levels in the stack between the plurality of levels of word lines and the plurality of levels of channel lines, include respective arrays of data storage regions (e.g. 518) in cross points of word lines and channel lines in adjacent levels of the plurality of levels of word lines and the plurality of levels of channel lines; and respective arrays of holes (e.g. 570 in FIG. 9) outside of the cross points. The thin-film 595 forms dielectric liners on the sides of the data storage regions 518 exposed through the array of holes during the deposition.

Figure 11:
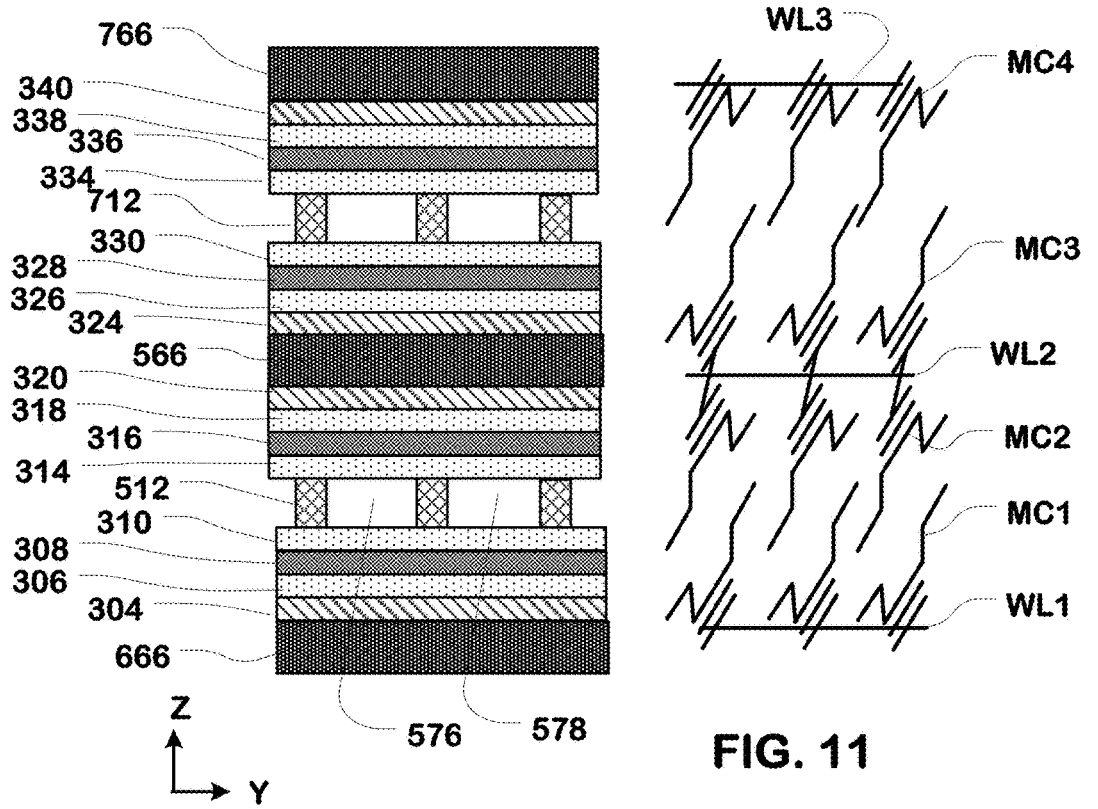
FIG. 11 is a cross-section taken in the word line direction (X-axis) of a 3D memory array structure as described herein.

FIG. 11 is a cross-section view showing four memory planes of a structure manufactured as described above, taken along the word line directions, next to a simplified circuit schematic. In the schematic, for reference, a channel line 512 and a word line 566 are labeled, corresponding to the same components in FIG. 11. Also, a word line level including word line 666 is disposed below the channel line level including channel line 512. A channel line level including channel line 712 is disposed above the word line level including word line 566. A word line level including word line 766 is disposed above the channel line level including channel line 712. Data storage levels are disposed between the word line levels and channel line levels. In this example, the data storage levels are dielectric charge trapping structures. The first data storage level includes a blocking dielectric in contact with the word lines in the word line level including, in this example, aluminum oxide layer 304 and silicon oxide layer 306. The first data storage level includes a charge trapping layer 308, and a tunneling layer 310, which contacts the channel lines in the overlying channel line level. The second data storage level has a similar structure including aluminum oxide layer 320, silicon oxide layer 318, charge trapping layer 316, and tunneling layer 314. The third data storage structure includes aluminum oxide layer 324, silicon oxide layer 326, charge trapping layer 328, and tunneling layer 330. The final data storage layer in this illustration includes aluminum oxide layer 340, silicon oxide layer 338, charge trapping layer 336 and tunneling layer 334 in contact with the adjacent channel line level including channel line 712.

As illustrated, voids (e.g. 576, 578) sometimes called air gaps, are formed between the channel lines in the channel line levels. The voids can be formed as a result of the lateral undercut etching and removal of the fill material during manufacturing, and contain insulating gas captured in the process. As a result, the voids act as good insulators between the channel lines. In some embodiments, a dielectric can be deposited through the holes, filling or partially filling the voids.

Figure 12:
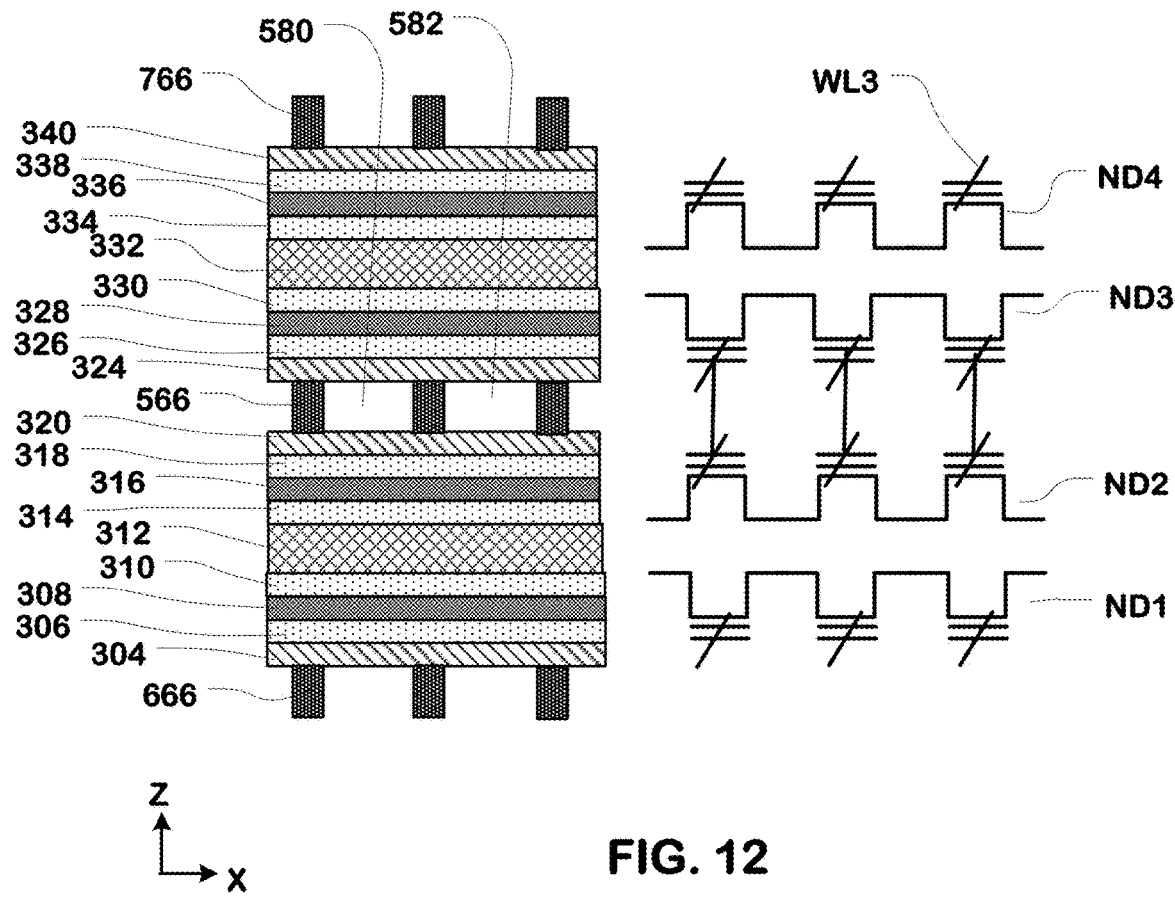
FIG. 12 is a cross-section taken in the channel line direction (Y-axis) of a 3D memory array structure as described herein.

As shown in the schematic, the structure of FIG. 12 includes three NAND memory cells (e.g. MC1) in a first level of memory cells coupled to word line WL1, which corresponds to the word line 666. The memory cells coupled to word line WL1 also have channels in the channel lines (e.g. 512) in the first level of channel lines. The schematic includes three memory cells (e.g. MC2) which have channels in the channel lines (e.g. 512) of the first level of channel lines. Thus, in this example, first and second planes of memory cells share a common level of channel lines. The three memory cells in the second level are coupled to word line WL2, which corresponds with the word line 566.

Likewise, another row of three memory cells (e.g. MC3) in the second level of channel lines is coupled to word line WL2 and channel lines (e.g. 712). A fourth row of memory cells (e.g. MC4) in a fourth level of memory cells is coupled to the word line WL3 and channel lines (e.g. 712), and the second level of channel lines, sharing channel lines with the third level of memory cells.

In other embodiments, in which the manufacturing process includes formation of the stack as shown in FIG. 4, the memory cells in the second and third levels of memory cells have independent word lines.

FIG. 12 shows a cross-section of four levels of memory cells taken in the channel line direction, orthogonal to the cross-section shown in FIG. 11 of the same structure. Like components are given the same reference numbers and not described again. In this diagram, the word lines (e.g. 566) in the second level of word lines are shown with voids 580, 582 in between. The voids can be formed as a result of the lateral undercut etching and removal of the fill material during manufacturing. As a result, the voids act as good insulators between the word lines.

In this cross-section, the memory cells are arranged in series with a common channel line (e.g. 312), as in a NAND string. The schematic shows NAND strings ND1 to ND4 in each of the four levels of memory cells. In a typical embodiment, a NAND string may have, for example, 32 or 64 memory cells, and can be implemented along with dummy cells, string select gates and ground select gates used to support NAND cell operation.

In a representative embodiment, the structure shown in FIGS. 11 and 12 with four memory planes can be on the order of 130 nm high, with each memory plane increasing the thickness by about 30 nm.

In other embodiments, the voids between the channel lines (e.g. 576,578) and between the word lines (e.g. 580, 582) can be filled with insulating materials, such as silicon dioxide, which can also act as insulator between the channel lines and the word lines.

Figure 13:
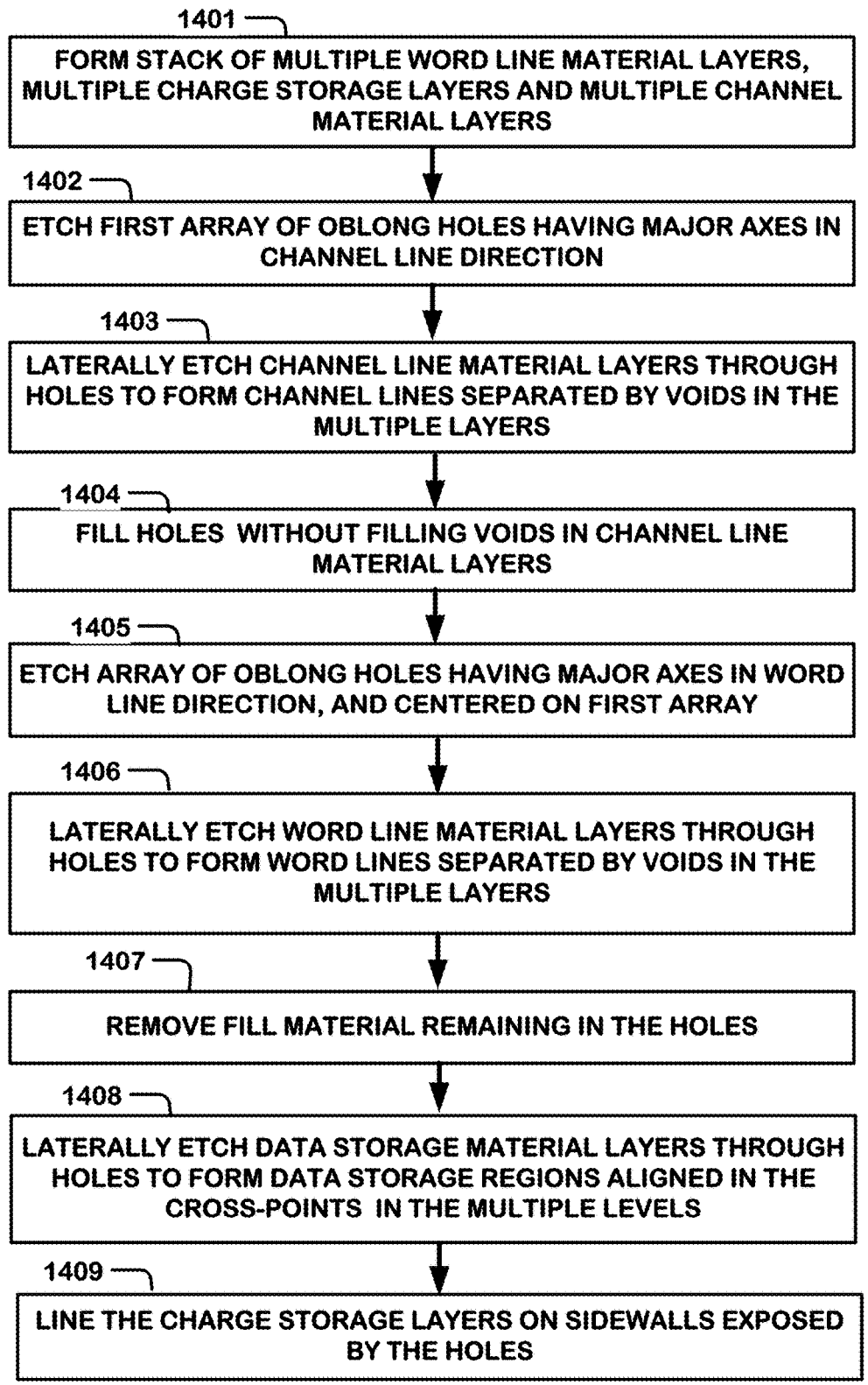
FIG. 13 is a simplified flowchart of a manufacturing method usable to make the structure described herein.

FIG. 13 is a simplified flowchart of a manufacturing process as described herein. According to the process of FIG. 13, the method includes forming a stack (FIG. 3A, FIG. 4) on an integrated circuit or other suitable substrate of multiple word line material levels, multiple charge storage levels and multiple channel material levels, corresponding to the memory cell levels to be manufactured (1401). Next, the process includes etching (FIG. 5) a first array of elliptical holes having major axes in a channel line direction (1402). After formation of the first array of oblong holes, the process includes laterally etching channel line material levels (FIG. 6) to form channel lines separated by voids in the multiple levels (1403). After laterally etching the channel line materials, the holes are filled (FIG. 7) with a planarization material (1404). Then a second array of elliptical holes is etched (FIG. 7), having major axes in the word line direction (1405). A second lateral undercut etch process (FIG. 8) is executed through the second array of elliptical holes in order to form word lines in the word line levels (1406). After the formation of the word lines in the word line levels, the fill material is removed (FIG. 9) leaving the word lines, channel lines, and data storage levels (1407). After removing the fill material, for some types of data storage materials requiring isolation of the data storage regions, another lateral selective etch can be performed through the remaining holes, targeting the data storage levels to form self-aligned data storage islands, in the data storage levels (1408). This lateral selective etch can be applied in stages for the different materials in the data storage levels. Next, the charge storage levels can be lined (FIG. 10) on the sidewalls exposed by the holes by deposition of a dielectric like silicon nitride (1409). The dielectric deposited in step 1409, or another dielectric deposited thereafter, can in some cases fill or partially fill the voids in the data storage levels, in the word line levels and in the channel line levels. To complete an integrated circuit, back-end-of-line processes are then executed.

A memory can be formed by this process comprising a stack of horizontal NAND memory levels, where the stack includes a plurality of levels of word lines, levels of word lines in the plurality of levels of word lines including, respectively, a plurality of word lines extending in the word line direction, with voids between the word lines; a plurality of levels of channel lines extending in channel line direction, levels of channel lines in the plurality of levels of channel lines including, respectively, a plurality of channel lines extending in the channel line direction, with voids between the channel lines; and data storage levels between levels of word lines and levels of channel lines including memory cell regions in cross points of corresponding word lines and channel lines. The memory formed this way can have an array of holes extending through the stack disposed outside of the cross points. In the memory formed this way, each horizontal memory plane in the stack can include memory cells having data storage regions in cross points of word lines and channel lines in adjacent layers of the plurality of layers of word lines and the plurality of layers of channel lines.

Accordingly, a manufacturing process is described for a 3D memory including stacked memory cell levels in which the data storage structures are formed on horizontal word lines and channel lines, rather than formed on vertical sidewalls. The process involves only two lithographic steps to form the memory structure, including masks to define the first and second arrays of elliptical holes. Selective, lateral undercut etching is used to form the word lines and bit lines, eliminating the need for extra lithographic steps. The structure includes voids that form seams in both the word line and channel line directions for isolation, allowing for good in-plane scaling of the structure.

Figure 14:
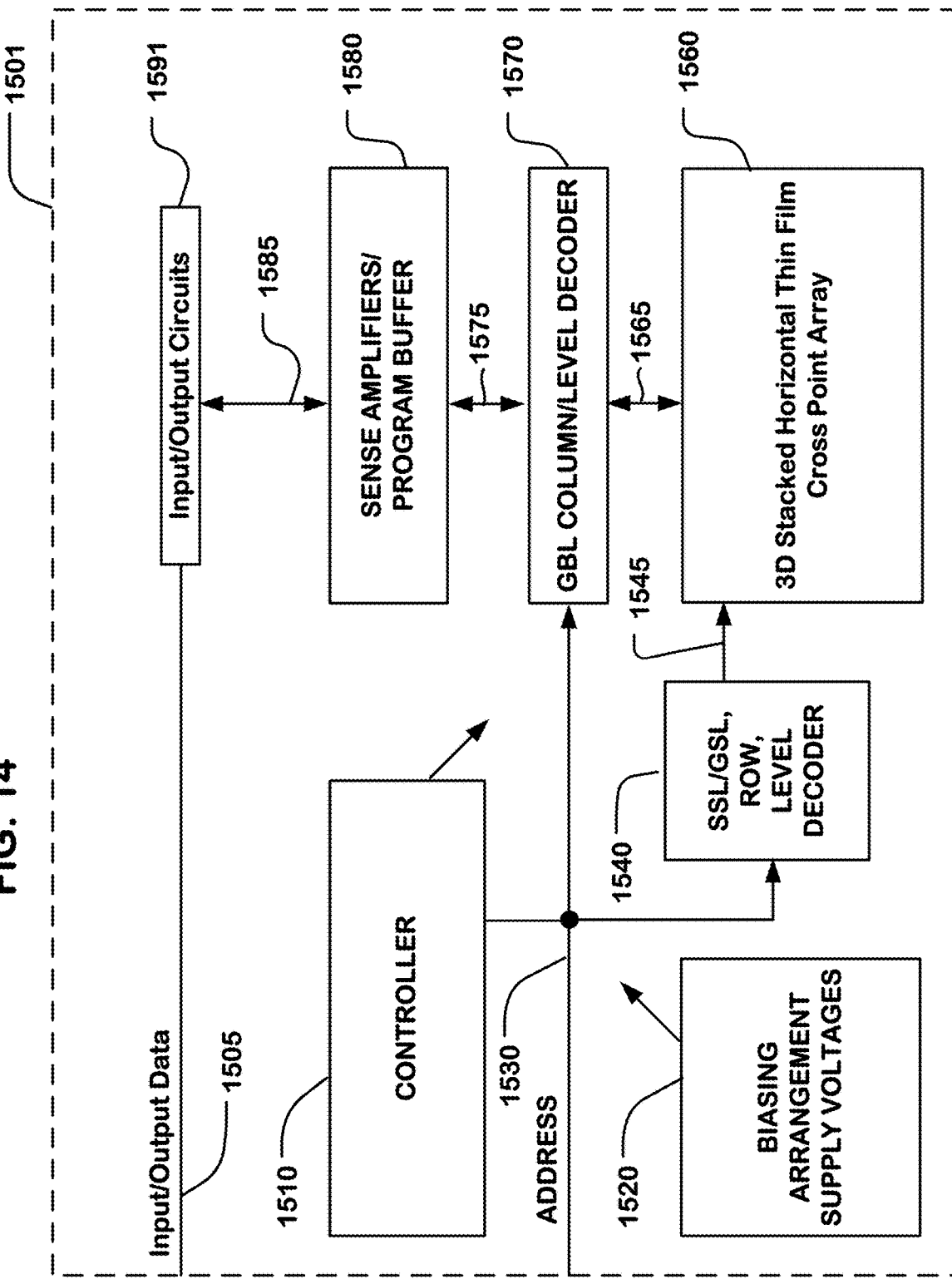
FIG. 14 is a simplified block diagram of an integrated circuit including a 3D stacked horizontal thin-film, cross-point array according to embodiments described herein.

FIG. 14 is a simplified chip block diagram of an integrated circuit 1501 including a 3D stacked horizontal thin-film cross-point array, with contact structure, such as staircase contact, used for making connection to peripheral circuitry on the device.

In a NAND array embodiment, an SSL/GSL/row and level (or plane) decoder 1540 is coupled via the contact structures to a plurality of SSL/GSL lines and word lines 1545, arranged in the memory array 1560. A global bit line column/level decoder 1570 is coupled to a plurality of global lines 1565 which are in turn coupled to the NAND strings arranged along columns in the memory array 1560 for reading data from and writing data to the memory array 1560. Addresses are supplied on bus 1530 from control logic 1510 to decoder 1570 and decoder 1540. Sense amplifier and program buffer circuits 1580 are coupled to the column decoder 1570, in this example via first data lines 1575. The column decoder 1570 can include circuits for selectively applying program and inhibit voltages to bit lines in the memory in response to the data values in the program buffer.

Sensed data from the sense amplifier/program buffer circuits are supplied via second data lines 1585 to input/output circuits 1591.

Input/output circuits 1591 drive the data to destinations external to the integrated circuit 1501. Input/output data and control signals are moved via data bus 1505 between the input/output circuits 1591, the control logic 1510 and input/output ports on the integrated circuit 1501 or other data sources internal or external to the integrated circuit 1501, such as a general purpose processor or special purpose application circuitry, or a combination of modules providing system-on-a-chip functionality supported by the memory array 1560.

In the example shown in FIG. 14, control logic 1510, using a bias arrangement state machine, controls the application of supply voltages generated or provided through the voltage supply or supplies in block 1520, such as read, erase, verify and program bias voltages. The control logic 1510 is operatively coupled to the memory array 1560 and peripheral circuits.

A memory device is described, comprising a first conductor layer which comprises a plurality of first conductor lines; a second conductor layer stacked on the first conductor layer, where the second conductor layer comprises a plurality of second conductor lines, the second conductor lines being orthogonal to the first conductor lines; and a plurality of memory elements are connected between the cross points of the first conductor lines and second conductor lines.

In embodiments, each first conductor line comprises at least two inflection points on the sidewalls of the first conductor line. In embodiments, each first conductor line comprises at least two protrusion portions which extend along the direction which is parallel with an extended direction of the second conductor lines.

In embodiments, each second conductor line comprises at least two inflection points on the sidewalls of the second conductor line. In embodiments, each second conductor line comprises at least two protrusion portions which extend along the direction which is parallel with an extended direction of the first conductor lines.

In embodiments, the memory elements connect to each other.

In embodiments, each memory element is located by self-alignment at the center area of four through holes. In embodiments each through hole comprises a middle hole region, and four edge hole regions located separately surrounding the middle hole region.

In embodiments, the first conductor layer is Silicon. In embodiments, the second conductor layer is Tungsten.

In embodiments each memory element comprises a tunneling layer, a charge trapping layer and a blocking layer.

A flowchart illustrating a manufacturing process for a memory device is described herein. It will be appreciated that many of the steps can be combined, or performed in a different sequence. For example, the etching of the array of channel line holes for formation of the channel lines can be performed after the etching of the array of word line holes for the formation of word lines in some manufacturing sequences. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory comprising:
   a plurality of levels of word lines extending in a word line direction interleaved with a plurality of levels of channel lines extending in channel line direction;
   data storage levels between the plurality of levels of word lines and the plurality of levels of channel lines, the data storage levels including:
      respective arrays of data storage regions in cross points of word lines and channel lines in adjacent levels of the plurality of levels of word lines and the plurality of levels of channel lines; and
      respective arrays of holes outside of the cross points; and
   wherein levels of word lines in the plurality of levels of word lines including, respectively, a plurality of word lines, the word lines in the plurality of word lines having regions between the cross points more narrow than regions in the cross points.

2. The memory of claim 1, levels of word lines in the plurality of levels of word lines including, respectively, a plurality of word lines extending in the word line direction, with voids that form seams between the word lines.

3. The memory of claim 1, levels of channel lines in the plurality of levels of channel lines including, respectively, a plurality of channel lines extending in the channel line direction, with voids that form seams between the channel lines.

4. The memory of claim 1, levels of channel lines in the plurality of levels of channel lines including, respectively, a plurality of channel lines, the channel lines in the plurality of channel lines having regions between the cross points more narrow than regions in the cross points.

5. The memory of claim 1, wherein the data storage levels comprise charge trapping layers.

6. The memory of claim 1, levels of word lines in the plurality of levels of word lines including, respectively, a plurality of word lines, sides of the word lines in the plurality of word lines being undercut etch perimeters spaced away in the channel line direction from side walls of adjacent holes in the array of holes.

7. The memory of claim 1, levels of channel lines in the plurality of levels of channel lines including, respectively, a plurality of channel lines, the channel lines in the plurality of channel lines being undercut etch perimeters spaced away in the word line direction from side walls of adjacent holes in the array of holes.

8. The memory of claim 1, including a dielectric liner on sides of the data storage regions.

9. The memory of claim 1, wherein the channel lines, word lines and data storage regions are self-aligned.

10. A memory comprising:
    a stack of horizontal NAND memory planes, the stack including:
       a plurality of levels of word lines, levels of word lines in the plurality of levels of word lines including, respectively, a plurality of word lines extending in the word line direction, with voids that form seams between the word lines;
       a plurality of levels of channel lines extending in channel line direction, levels of channel lines in the plurality of levels of channel lines including, respectively, a plurality of channel lines extending in the channel line direction, with voids that form seams between the channel lines; and
    charge trapping levels between levels of word lines and levels of channel lines including memory cell regions in cross points of corresponding word lines and channel lines; and
    an array of holes extending through the NAND memory planes of the stack disposed outside of the cross points;
    wherein each horizontal NAND memory plane in the stack includes memory cells having data storage regions in cross points of word lines and channel lines in adjacent levels of the plurality of levels of word lines and the plurality of levels of channel lines, and wherein levels of word lines in the plurality of levels of word lines including respectively, a plurality of word lines, the word lines in the plurality of word lines having regions between the cross points more narrow than regions in the cross points; and wherein levels of channel lines in the plurality of levels of channel lines including, respectively, a plurality of channel lines, the channel lines in the plurality of channel lines having regions between the cross points more narrow than regions in the cross points.

11. The memory of claim 10, wherein the charge trapping levels comprise dielectric charge trapping layers.

12. A method for manufacturing a memory comprising:
forming a plurality of levels of word lines extending in a word line direction and interleaved with a plurality of levels of channel lines extending in a channel line direction;
forming data storage levels between the plurality of levels of word lines and the plurality of levels of channel lines, the data storage levels including respective arrays of data storage regions in cross points of word lines and channel lines in adjacent levels of the plurality of levels of word lines and the plurality of levels of channel lines, and respective arrays of holes outside of the cross points;
wherein levels of word lines in the plurality of levels of word lines including, respectively, a plurality of word lines, the word lines in the plurality of word lines having regions between the cross points more narrow than regions in the cross points.

13. The method of claim 12, wherein said forming a plurality of levels of word lines extending in a word line direction and interleaved with a plurality of levels of channel lines extending in channel line direction, and said forming charge trapping levels between the plurality of levels of word lines and the plurality of levels of channel lines, comprises:
forming a stack of levels of material, the stack including levels of word line material and levels of channel line material separated by charge trapping levels;
etching channel line elliptical holes in the stack having major axes in the channel line direction;
laterally etching the channel line material exposed in the channel line elliptical holes to form the plurality of levels of channel lines;
etching word line elliptical holes in the stack having major axes in the word line direction;
laterally etching the word line material exposed in the word line elliptical holes to form the plurality of levels of word line lines; and
wherein the arrays of holes include holes formed by combination of the word line elliptical holes and the channel line elliptical holes.

14. The method of claim 13, including etching the channel line elliptical holes and laterally etching the channel line material before etching the word line elliptical holes; and
filling the channel line elliptical holes with fill material before etching the word line elliptical holes, and wherein the word line elliptical holes extend through the fill material in the channel line elliptical holes.

15. The method of claim 14, including after etching the word line elliptical holes and laterally etching the word line material, removing the fill material and depositing a dielectric liner on sides of the charge trapping level exposed in the array of holes.

16. The method of claim 12, wherein levels of word lines in the plurality of levels of word lines including, respectively, a plurality of word lines extending in the word line direction, with voids between the word lines, and levels of channel lines in the plurality of levels of channel lines including, respectively, a plurality of channel lines extending in the channel line direction, with voids between the channel lines.

17. The method of claim 12, levels of channel lines in the plurality of levels of channel lines including, respectively, a plurality of channel lines, the channel lines in the plurality of channel lines having regions between the cross points more narrow than regions in the cross points.

18. The method of claim 12, wherein the charge trapping levels comprise dielectric charge trapping layers.

19. The method of claim 12, wherein the channel lines, word lines and data storage regions are self-aligned.

20. A memory comprising:
a plurality of levels of word lines extending in a word line direction interleaved with a plurality of levels of channel lines extending in channel line direction;
data storage levels between the plurality of levels of word lines and the plurality of levels of channel lines, the data storage levels including:
respective arrays of data storage regions in cross points of word lines and channel lines in adjacent levels of the plurality of levels of word lines and the plurality of levels of channel lines; and
respective arrays of holes outside of the cross points; and
wherein levels of channel lines in the plurality of levels of channel lines including, respectively, a plurality of channel lines, the channel lines in the plurality of channel lines having regions between the cross points more narrow than regions in the cross points.

* * * * *